(12) United States Patent
Yu

(10) Patent No.: US 6,419,514 B1
(45) Date of Patent: Jul. 16, 2002

(54) ZIF SOCKET

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/876,775

(22) Filed: Jun. 6, 2001

(30) Foreign Application Priority Data

Apr. 24, 2001 (TW) ...................................... 90206479 U

(51) Int. Cl.⁷ ........................................... H01R 13/625
(52) U.S. Cl. ..................................................... 439/342
(58) Field of Search .......................... 439/342, 259–270

(56) References Cited

U.S. PATENT DOCUMENTS

| | | | | |
|---|---|---|---|---|
| 5,167,515 A | * | 12/1992 | Matsuoka et al. | 439/342 |
| 5,489,218 A | * | 2/1996 | McHugh | 439/342 |
| 5,569,045 A | * | 10/1996 | Hsu | 439/342 |
| 5,600,540 A | * | 2/1997 | Blomquist | 361/704 |
| 5,679,020 A | * | 10/1997 | Lai et al. | 439/342 |
| 5,722,848 A | * | 3/1998 | Lai et al. | 439/342 |
| 5,947,778 A | * | 9/1999 | Lai et al. | 439/342 |

* cited by examiner

*Primary Examiner*—Gary F. Paumen
(74) *Attorney, Agent, or Firm*—We Te Chung

(57) ABSTRACT

A ZIF socket (1) adapted for retaining an integrated circuit chip (85) thereon comprises a base (10), a sliding cover (40), an actuator (70) and a retainer (60). The base comprises a clip (291) extending toward the chip with an upper distance offset therefrom for clipping an upper face of the chip and a recess (30) opposite to the clip. The sliding cover is movably assembled on the base and includes a slot (46) in vertical alignment with the recess. The actuator is rotatably assembled between the base and the sliding cover and drives the sliding cover to move horizontally on the base. The retainer is assembled in the recess of the base and extending beyond the sliding cover through the slot. The retainer is moved by the sliding cover to engage with the chip for securely retaining the chip on the socket.

1 Claim, 7 Drawing Sheets

ZIF SOCKET

BACKGROUND OF THE INVENTION

1. Field of the Invention

The present invention relates to a ZIF socket, and particularly to a ZIF socket with a retainer for securely retaining an integrated circuit chip thereon.

2. Description of Related Art

U.S. Pat. No. 5,489,218 discloses a conventional ZIF socket with an insulative base, a sliding cover, a plurality of terminals and an actuator. The insulative base comprises a plurality of receiving holes from an upper face to a lower face thereof for receiving the terminals. The sliding cover is movably assembled on the upper face of the base and comprises a plurality of through holes in vertical alignment with corresponding receiving holes. The actuator includes a pair of coaxial pivots pivotably received between the base and the sliding cover. A curved arm extends between the pivots and a handle extends perpendicularly from an end of one pivot. The handle rotates and makes the curved arm to rotate about an axis of the pivot thereby driving the sliding cover to move horizontally on the base and enabling the terminals to electrically connect with contacts of a corresponding integrated circuit chip carried by the cover. However, the integrated circuit chip is assembled on the socket only via a force between the contacts of the chip and the terminals of the socket, so it is not secure. While the socket is subjected to vibration or shock, the chip may be loosened from the socket.

U.S. Pat. No. 5,600,540 discloses a retainer for retaining an integrated circuit chip and a heat sink on a socket. Referring to FIG. 9, the retainer 92 is constructed of two pieces. One piece is an elongated strap 921 for pressing against a heat sink 91. A bent arm 922 extends downwardly from an end of the strap 921 for hooking on a lug 931 of the socket 93. The second piece 923 is rotatably mounted on a free end of the elongated strap 921 and when forced down and rotated inward, it will hook on another lug 931 of the socket and retain the heat sink 91 with an integrated circuit chip 90 on the socket 93. However, limited assembling space makes the assembly of the retainer 92 difficult. In addition, while the socket 93 is subjected to vibration or shock, the chip 90 and the heat may overcome the elasticity of the strap 921, therefore, the connection among the heat sink 91, the vertical wall 90 and the socket 93 is unstable.

Therefore, an improved ZIF socket is required to overcome the disadvantages of the conventional ZIF socket.

SUMMARY OF THE INVENTION

Accordingly, one object of the present invention is to provide a ZIF socket securely retaining an integrated circuit chip thereon to achieve a stable connection.

Another object of the present invention is to provide a socket with a retainer convenient to assemble the integrated circuit chip thereon.

In order to achieve the objects set forth, a ZIF socket adapted for retaining an integrated circuit chip thereon comprises a base, a sliding cover, an actuator and a retainer. The base comprises a vertical wall extending upwardly from a front wall thereof and a recess opposite to the wall. A locker extends toward the chip from a top of the wall for clipping an upper edge of the chip. The sliding cover is movably assembled on the base and includes a slot in vertical alignment with the recess. The actuator includes a cam rod pivotably sandwiched between the base and the sliding cover and drives the sliding cover to move horizontally on the base. The retainer is assembled in the recess of the base and extending beyond the sliding cover through the slot. The retainer is moved by the sliding cover to engage with the chip for securely retaining the chip on the socket.

Other objects, advantages and novel features of the invention will become more apparent from the following detailed description when taken in conjunction with the accompanying drawings.

DETAILED DESCRIPTION OF THE INVENTION

Figure 1:
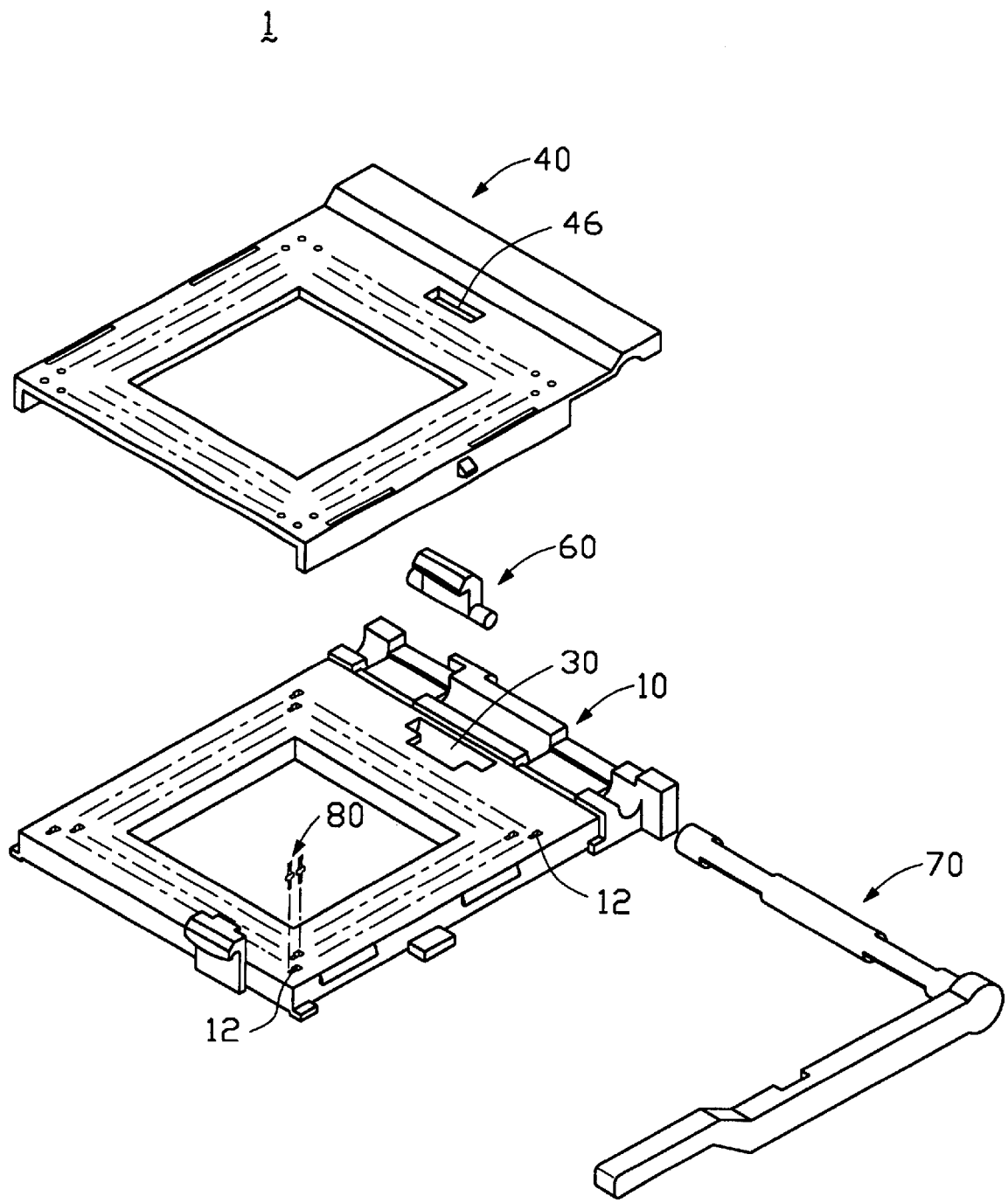
FIG. 1 is a perspective exploded view of a ZIF socket in accordance with the invention.

Reference will now be made to the drawing figures to describe the present invention in detail.

Referring to FIG. 1, a ZIF socket of the present invention comprises a base 10, a sliding cover 40, a retainer 60, an actuator 70 and a plurality of terminals 80.

Figure 2:
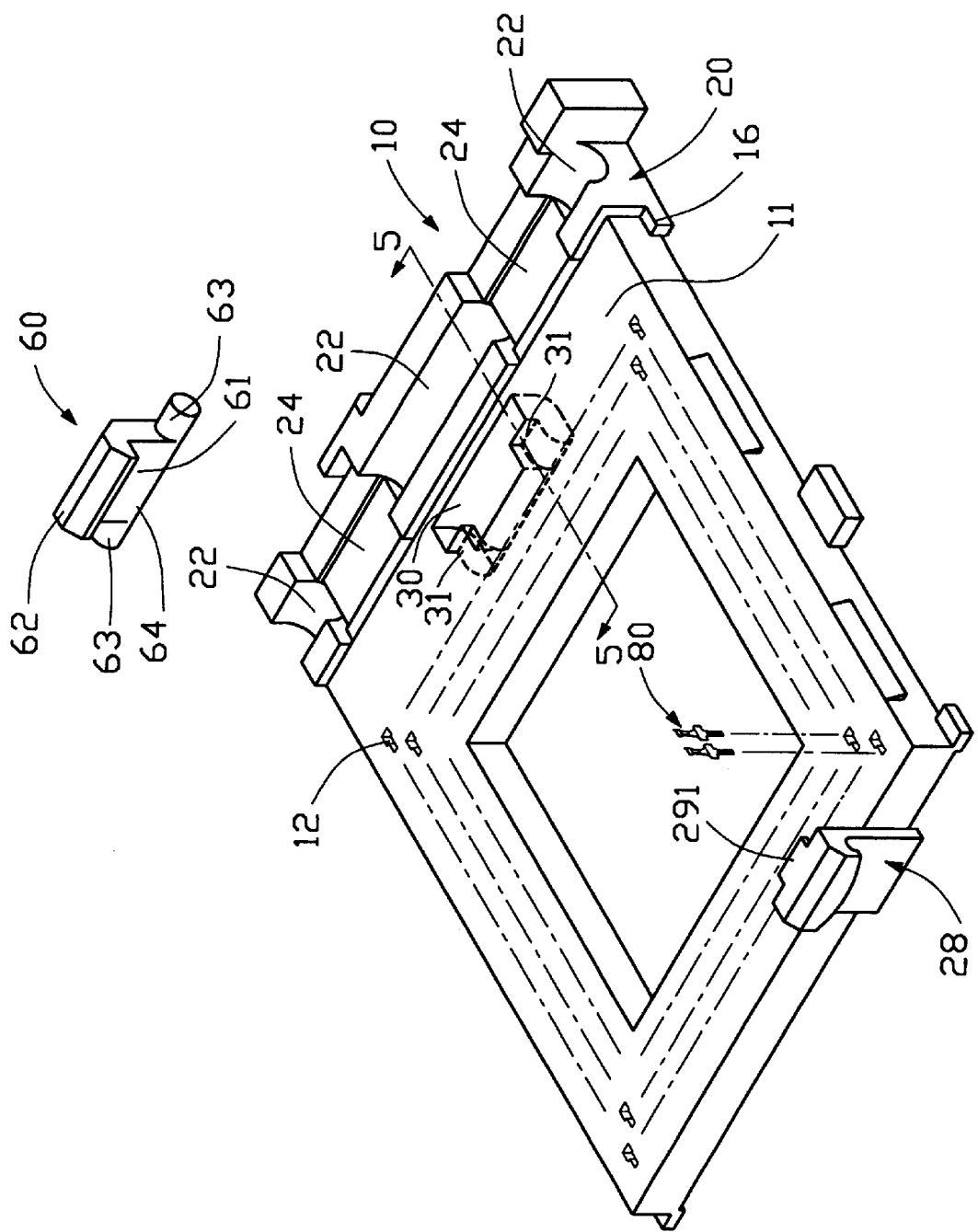
FIG. 2 is a perspective exploded view of a base, terminals and a retainer of the ZIF socket of FIG. 1.

Referring to FIG. 2, the base 10 comprises a rectangular member 11 and a cam journal section 20 in a rear end thereof. The rectangular member 11 comprises a plurality of spaced apart cavities 12 extending vertically through the base 10 for receiving corresponding terminals 12 and a vertical wall 28 extending upwardly from a front wall opposite to the cam journal section 20. A clip 291 extends from a top of the vertical wall 28 forward the cam journal section 20. The rectangular member 11 includes a T-shaped recess 30 near the cam journal section 20. The recess 30 has a first curved face 32 and a second curved face 33, referring to FIGS. 5 and 6. The cam journal section 20 includes three spaced apart lower bearing portion 22 and two lower operation portions 24 each intermediating between two spaced bearing potions 22.

The retainer 60 is retained in the recess 30 of the base 10 and includes a rectangular main body 61 with a semi-cylindrical shaped lower face 64. A locker 62 extends perpendicularly from a top of the main body 61 and a pair of opposite pivots 63 extend transversely from a bottom of the main body 61.

Figure 3:
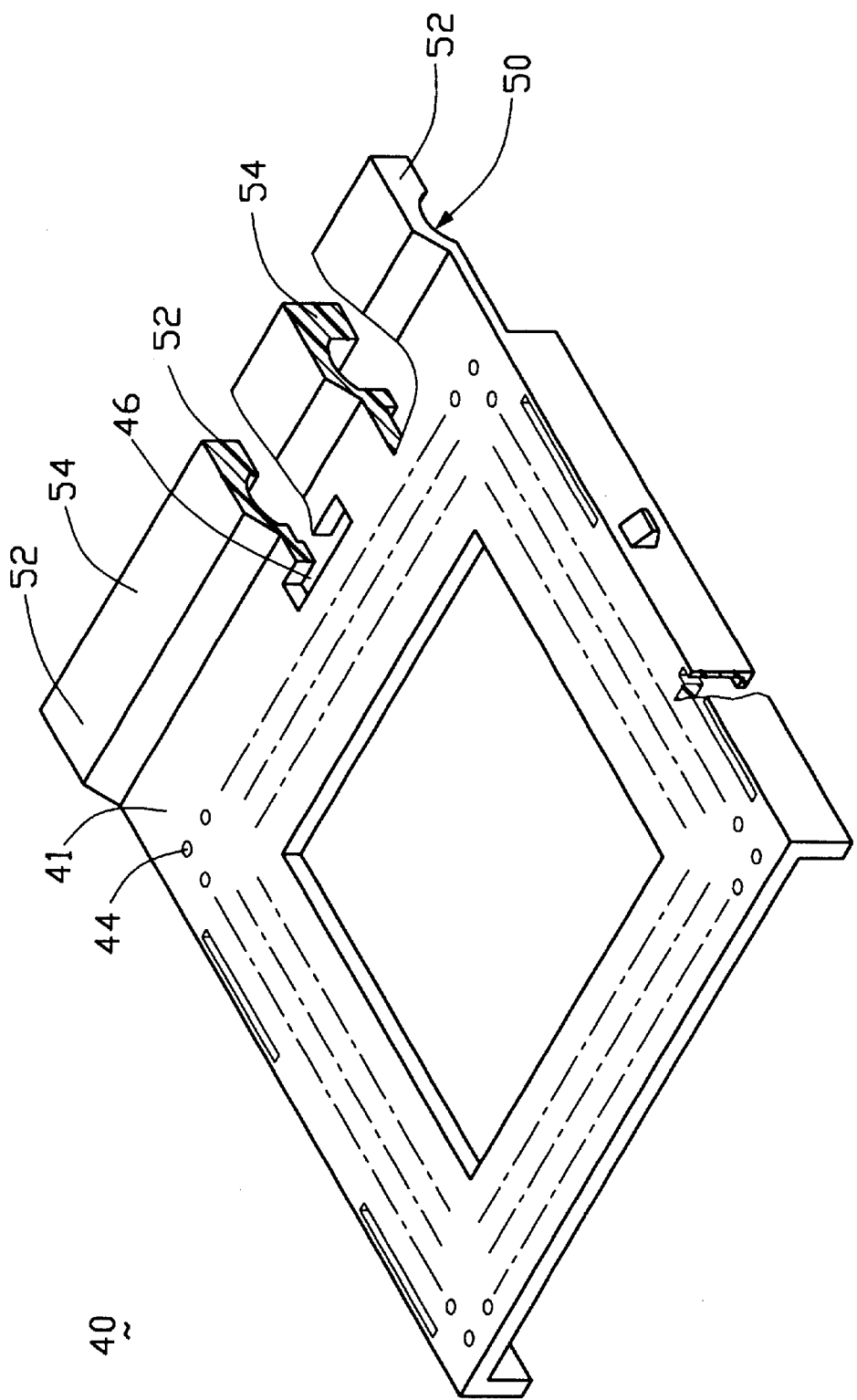
FIG. 3 is a perspective view of a sliding cover of the ZIF socket of FIG. 1.

Referring to FIG. 3, similar to the base 10, the sliding cover 40 comprises a rectangular member 41 and a shroud section 50 in a rear end thereof. The rectangular member 41 includes a plurality of through holes 44 in alignment with corresponding cavities 12 of the base 10 and a rectangular slot 46 near the shroud section 50. It should be noted that the width of the slot 46 is slightly larger than that of main body 61 of the retainer 60 and the length of the slot 46 is slightly smaller than that of the pivot 63. The shroud section 50 includes three transverse spaced apart upper bearing portions 52 in vertical alignment with corresponding lower bearing portions 22 and two spaced upper operation sections 54 each intermediating between two adjacent upper bearing portions 52.

Figure 4A:
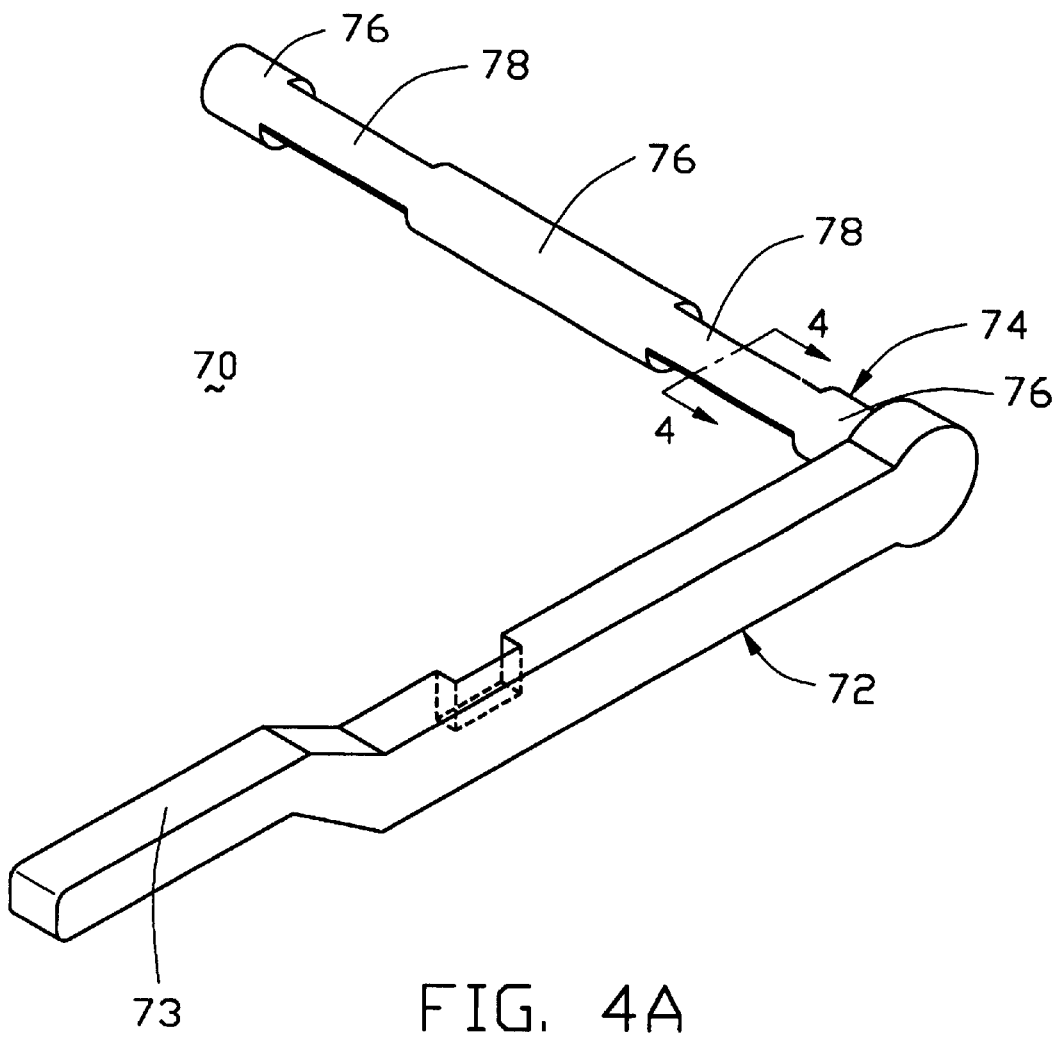
FIG. 4A is a perspective view of an actuator of the ZIF socket of FIG. 1.
Figure 4B:
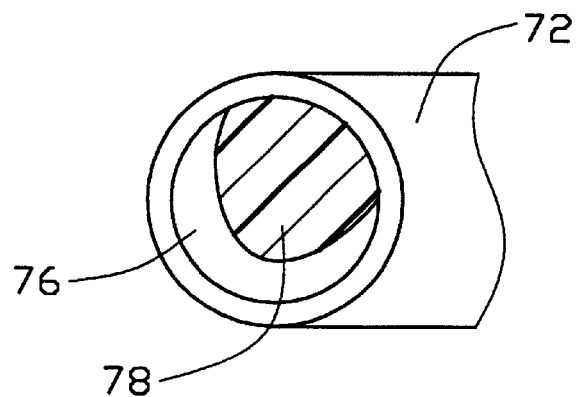
FIG. 4B is a cross-sectional view along line 4—4 of FIG. 4A.

Referring to FIG. 4A, the actuator 70 is substantialy L-shaped and includes a cam rod 74 pivotably sandwiched between the cam journal section 50 and the shroud section 50. The cam rod 74 includes three spaced round coaxial pivots 76 and two cams 78 each intermediating between two adjacent pivots 76. A manual handle 72 extends perpendicularly from an end of the cam rod 74. The handle 72 includes a manual offset shaft 73 parallel to the handle 72, allowing convenient manipulation of the actuator 70.

Figure 5:
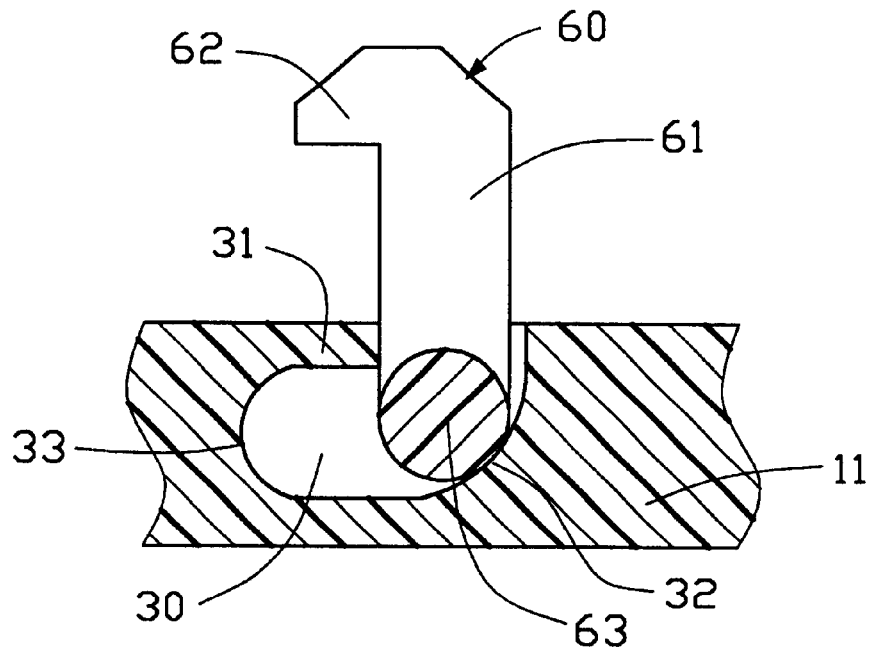
FIG. 5 is a cross-sectional view along line 5—5 of FIG. 2 wherein the retainer is just assembled to the base.
Figure 6:
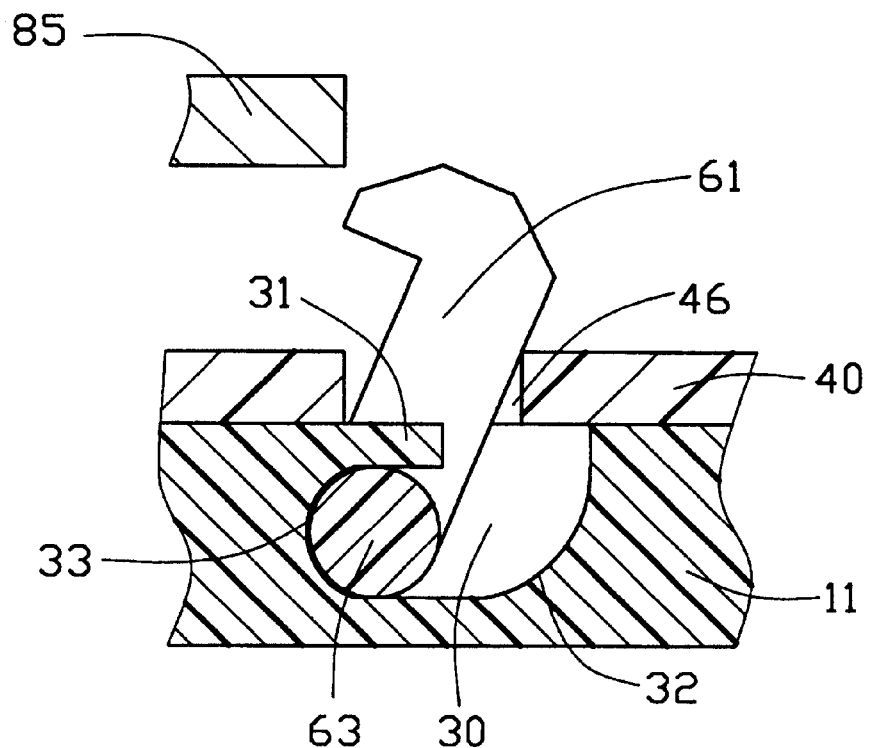
FIG. 6 is a cross-sectional view along line 5—5 of FIG. 2 wherein the retainer is assembled to the base and an integrated circuit chip is not yet assembled to the base.

Referring to FIGS. 5 and 6, in assembly, the retainer 60 is placed in the recess 30 and it will move to the second curved surface 33 along the first curved surface 32. A pair of stop walls 31 above the recess 30 prevent the pivots 63 from moving upwardly and retain the retainer 60 in a free position in the recess 30 as shown in FIG. 6. After the cam rod 74 of the actuator 70 is placed on the cam journal section 20 with the pivots 76 received in corresponding lower bearing portions 22, the sliding cover 40 is movably assembled on the base 10 with the main body 61 of the retainer 60 extending through the slot 46. Therefore, the cam rod 74 is pivotably sandwiched between the cam journal section 50 and the shroud section 50. Since the pivot 63 is longer than the slot 46, the pivot 63 cannot move upwardly beyond the sliding cover 40 through the slot 46.

Figure 7:
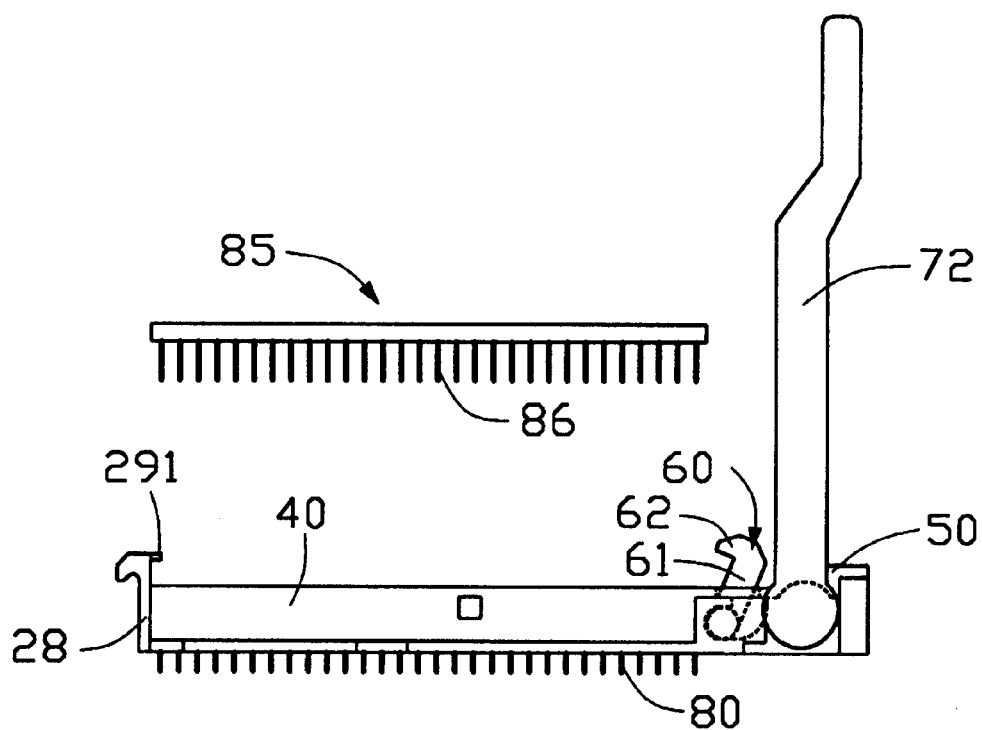
FIG. 7 is a side view of the ZIF socket with the integrated circuit chip.
Figure 8:
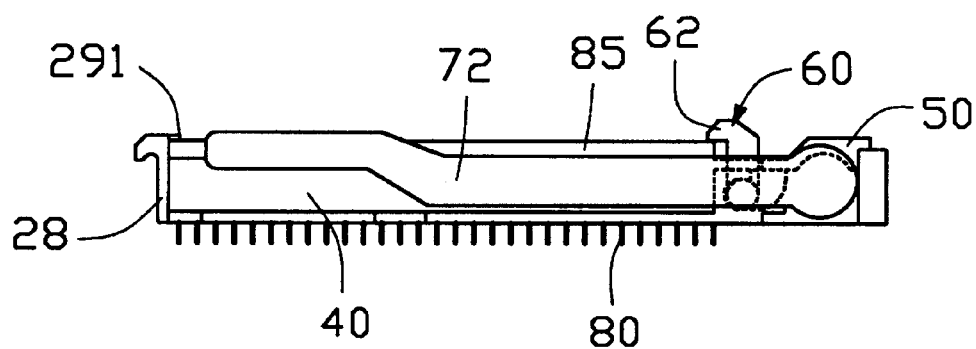
FIG. 8 is a side view of the ZIF socket with the retainer clipping on the integrated circuit chip.
Figure 9:
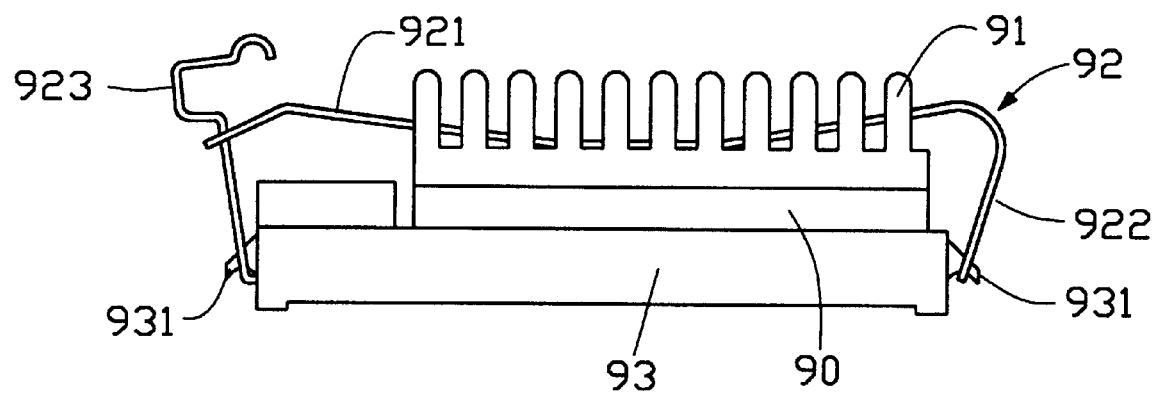
FIG. 9 is side view of a conventional ZIF socket with a retainer mounting a heat sink and an integrated circuit chip thereon.

Referring to FIGS. 7 and 8, while the handle 72 is in a vertical position, an integrated circuit chip 85 is placed on the socket 1 with the leads 86 received in corresponding through holes 44. When the handle 72 is rotated to a horizontal position, the cams 78 actuates both the sliding cover 40 and the chip 85 to move forwardly thereby engaging the chip 85 with the clip 291 of the vertical wall 28 and makes the leads 86 of the chip 85 move to reach an electrical connection with the terminals 80 of the socket 1. The forward movement of the sliding cover 40 also makes the retainer 60 rotate from the free position to a locked position shown in FIG. 8, so that the locker 62 clips on the upper face of the integrated circuit chip 85. Therefore, the integrated circuit chip 85 is securely retained on the socket 1.

The retainer 60 and the vertical wall 28 constitute a retainer device. The retainer 60 is actuated by the sliding cover 40 and retains the chip 85 on the socket 1, so the retainer device is convenient in use. In addition, the retainer 60 can be adapted according to different use, such as for retaining both an integrated circuit chip and a heat sink on a socket.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket adapted for retaining an integrated circuit chip thereon, comprising:

a base comprising a clip extending toward the chip with an upper distance offset therefrom for clipping an upper edge of the chip and a recess opposite to the clip;

a sliding cover being movably assembled on the base and including a slot in vertical alignment with the recess;

an actuator being rotatably assembled between the base and the sliding cover and driving the sliding cover to move on the base; and a retainer being assembled in the recess of the base and extending beyond the sliding cover through the slot, the retainer being movable by the sliding cover to engage with the chip;

wherein the retainer comprises a main body extending through the slot and a locker extending toward the chip from a top of the main body for clipping an upper face of the chip to press the chip against the cover;

wherein the retainer comprises a pair of opposite pivots extending transversely from a bottom thereof received in the recess and a stop wall is provided above the recess for preventing the retainer from moving upwardly;

wherein the recess has a first lower curved surface and a second lower curved surface, and the pivot is seated to the curved surface;

wherein the base includes a vertical wall extending upwardly from a front sidewall thereof, the clip extending from a top of the vertical wall toward the chip.

* * * * *